(12) United States Patent
Randhawa et al.

(10) Patent No.: US 9,275,849 B2
(45) Date of Patent: Mar. 1, 2016

(54) SINGLE-CHAMBER APPARATUS FOR PRECISION CLEANING AND DRYING OF FLAT OBJECTS

(75) Inventors: Rubinder Randhawa, Dublin, CA (US); Basha Sajjad, Pleasanton, CA (US); Shmuel Erez, San Jose, CA (US); Harry Christov, Campbell, CA (US)

(73) Assignee: Planar Semiconductor, Inc., San Jose, CA (US)

( * ) Notice: Subject to any disclaimer, the term of this patent is extended or adjusted under 35 U.S.C. 154(b) by 1037 days.

(21) Appl. No.: 11/881,691

(22) Filed: Jul. 30, 2007

(65) Prior Publication Data

US 2009/0032070 A1 Feb. 5, 2009

(51) Int. Cl.
*H01L 21/02* (2006.01)
*H01L 21/67* (2006.01)

(52) U.S. Cl.
CPC .... *H01L 21/02052* (2013.01); *H01L 21/67028* (2013.01); *H01L 21/67034* (2013.01); *H01L 21/67051* (2013.01)

(58) Field of Classification Search
CPC ................................................. H01L 21/02052
USPC ......................................................... 134/137
See application file for complete search history.

(56) References Cited

U.S. PATENT DOCUMENTS

| | | | |
|---|---|---|---|
| 5,052,886 A * | 10/1991 | Moroi | 414/757 |
| 5,351,419 A | 10/1994 | Franka et al. | |
| 6,082,377 A * | 7/2000 | Frey | 134/6 |
| 6,247,198 B1 * | 6/2001 | Kobayashi et al. | 15/77 |
| 6,357,996 B2 * | 3/2002 | Bacchi et al. | 414/754 |
| 6,746,543 B2 * | 6/2004 | Kamikawa et al. | 134/26 |
| 6,784,106 B2 | 8/2004 | Bae et al. | |
| 6,837,944 B2 | 1/2005 | Kashkoush et al. | |
| 6,863,741 B2 | 3/2005 | Orii et al. | |
| 6,875,289 B2 | 4/2005 | Christenson et al. | |
| 6,901,685 B2 | 6/2005 | Yamaguchi et al. | |
| 6,918,192 B2 | 7/2005 | Yang | |
| 6,959,503 B2 | 11/2005 | Miranda et al. | |
| 7,021,319 B2 | 4/2006 | Verhaverbeke et al. | |
| 2002/0189643 A1 | 12/2002 | Chen et al. | |
| 2004/0010932 A1 * | 1/2004 | Chon et al. | 34/267 |
| 2006/0174919 A1 | 8/2006 | Randhawa | |

* cited by examiner

*Primary Examiner* — Jason Ko

(74) *Attorney, Agent, or Firm* — Schwegman Lundberg & Woessner, P.A.

(57) ABSTRACT

A single-chamber type cleaning-drying apparatus for flat objects, such as semiconductor wafers, wherein cleaning is carried out by impinging both sides of the wafer, which rotates at a relatively low speed, with jets of a washing liquid and wherein subsequent drying is carried out in the same chamber by increasing the rotation speed of the wafer and supplying isopropyl-alcohol (IPA) mist onto the wafer from the top of the chamber. After the IPA forms a solution with the residue of water on the wafer, the drying process is accelerated by supplying gaseous nitrogen through nozzles arranged on both sides of the wafer he coaxially with the wafer center. As a result, the IPA-water solution quickly evaporates without leaving traces of water drops on the dried surface.

14 Claims, 6 Drawing Sheets

SINGLE-CHAMBER APPARATUS FOR PRECISION CLEANING AND DRYING OF FLAT OBJECTS

FIELD OF THE INVENTION

The present invention relates to semiconductor manufacture, in particular to an apparatus for cleaning and drying flat objects, such as semiconductor substrates. More specifically, the invention relates to a single-chamber apparatus for cleaning and sequentially drying semiconductor substrates to high precision in a single working chamber.

DESCRIPTION OF THE PRIOR ART

Cleaning of surfaces of wafer substrates is one of the most important steps in the fabrication of semiconductor microelectronic devices. It is well known that presence of chemical contaminants and particles of impurities may significantly reduce the yield of products and noticeably affect performance and reliability of the produced semiconductor devices.

In view of the present trend in the semiconductor industry that goes far beyond features of a device such as submicron sizes, effective techniques for cleaning silicon wafers, e.g., initially and after oxidation and patterning, are now more important than ever before because of the extreme sensitivity of semiconductor surfaces to the presence of contaminants. Specifically, total metallic impurities should be far less than $10^{10}$ atoms per $cm^2$. Presence of particles larger than 0.1 µm in size should be much less than approximately 0.1 per $cm^2$. This means that particles, e.g., on the 200 mm wafer, may be considered to be the threshold of cleanliness.

It should be further noted that contamination in the level of monolayers could drastically alter surface properties such as wettability, adhesion, or optical and electrical characteristics of a surface. Particles in the micron to submicron range trace contaminants such as non-volatile residues (NVR) in the range of micrograms/$cm^2$ and pictogram/$cm^2$ Ionics in the same range or traces of corrosion have become part of the daily concerns of the manufacturing engineers in major industries such as semiconductor, automotive, disk drive, optics, ophthalmic, glass, medical, aerospace, pharmaceuticals, and tool coatings, among others.

Therefore the choice of types of cleaning liquids used for wafer cleaning should be evaluated from the point of view of satisfaction of the above requirements in the treated wafers. To select an effective cleaning method, the three essential factors directly influencing cleaning results are the cleaning chemistry, the particle-removing method, and the process parameters.

There exists a plurality of various methods and processes for wafer cleaning that can be subdivided into dry-physical, wet-physical, combined wet-physical/chemical, vapor-phase methods, etc. Furthermore, there is a series of apparatus for implementing the aforementioned cleaning processes in the industry. A review of various cleaning apparatus is given in more detail in an earlier patent application of one of the present applicants (see US Patent Application Publication No. 20060174919, published on Aug. 10, 2006; inventor: R. Randhawa). The aforementioned patent application relates to an advanced wet-process cleaning method and apparatus for pulsed jet cleaning of flat objects based on the principle of enhancing formation of droplets of the cleaning medium by increasing the boundary surface area between the jets emitted though the nozzles of the cleaning unit and the surrounding atmosphere. In various embodiments of the invention, these droplet formation enhancement means are located inside the nozzle at the nozzle outlet end and are made in the form of a jet splitter, threaded grooves on the inner surface of the nozzle body, or in the form of a thin tube for the supply of gas into the flow of the liquid cleaning medium for the formation of gas bubbles in the medium. The method also takes into account such factors as mass ratio between the droplets and the contaminant particles, velocity of droplets, organization and sequence of jets that attack the surface of the wafer, and flows that wash-out the separated particles, etc.

It should be noted that the process of cleaning should be selected with reference to the state of the substrates since the substrate may be in a hydrophobic or hydrophilic state. Hydrophobic substrate is more difficult to clean than hydrophilic substrate because of its poor wettability with aqueous cleaning solutions. Normally, after various processes of chemical treatment, wafer substrates are cleaned with de-ionized water, the efficiency of which is very low. Drying of hydrophobic wafers is even more challenging than cleaning because of the high affinity of particle contaminants to hydrophobic surfaces. Furthermore, since pure de-ionized water is typically sprayed directly onto the hydrophobic surface during rinsing, watermarks and residue are commonly observed on hydrophobic surfaces after drying. These watermarks and residue may cause problems in subsequent use of the semiconductor wafers. Normally after wet cleaning, a substrate must be dried, and the drying should not introduce any secondary contamination such as aforementioned marks and residue. Known drying processes sometimes include the use of heated liquids or heated gases, such as heated nitrogen gas, during and after rinsing for the removal of unwanted droplets and films from the wafer surfaces.

Known in the art of cleaning and drying semiconductor wafers is the so-called Marangoni process, which comprises a wet-cleaning process resulting in a completely dried substrate because the substrate is gradually dried directly during extraction of the substrate from the cleaning liquid. More specifically, after the wafers are rinsed, e.g., by de-ionized water, the substrate is fed to an upper interior space of a rinsing bath, and the de-ionized water is slowly withdrawn into a space filled with gas or vapor. Filling the interior of the drying chamber with the vapor of isopropyl alcohol (hereinafter referred to as "IPA") can significantly enhance the drying process of the Marangoni process.

More specifically, use of IPA supplied within the gas environment, thus replacing the liquid environment, becomes very popular because IPA does not leave marks or residue on the cleaned and dried surfaces of the semiconductor substrates, and use of the Marangoni process becomes very popular because it drastically reduces the amount of de-ionized water needed for cleaning.

Given below is a short review of patent documents dedicated to cleaning and drying using IPA and the Marangoni process, as well as other specific methods of cleaning and drying.

For example, US Patent Application Publication No. 20020189643 published in 2002 (Inventor Y. Chen, et al.) discloses a method for cleaning and drying hydrophobic wafers. In the first aspect, the method cleans and dries wafers without applying pure de-ionized water (DI) to the wafer. In the second aspect, the method cleans a wafer by applying pure DI water to the wafer only for a short duration of time such that the DI water application ceases before or as soon as a surfactant solution is rinsed from the wafer; thereafter, the wafer is dried. In a further aspect, a hydrophobic wafer is wetted with a surfactant as it is transferred between cleaning apparatuses and is rinsed by means of a diluted surfactant or by means of a brief DI water spray and is thereafter dried.

U.S. Pat. No. 6,918,192 issued in 2005 to J. Yang describes a substrate drying system for drying substrates after the substrates are washed by typically using de-ionized water. This substrate drying system comprises a substrate-cleaning tank in which the substrates are washed. A dry pump is provided in fluid communication with the substrate-cleaning tank. A container that contains a supply of a liquid drying fluid, typically isopropyl alcohol (IPA), is further provided in fluid communication with the substrate-cleaning tank. In application, the dry pump induces reduced pressure inside the substrate-cleaning tank and the drying fluid container. This reduces vapor pressure, and thus, the boiling point of the drying fluid, such that the drying fluid vaporizes and remains in the vaporized state throughout transit to the substrate-cleaning tank and during drying of the substrate. Consequently, premature condensation of the drying fluid in the substrate-cleaning tank is prevented, eliminating formation of watermarks and deposits of particles, particularly in deep trenches formed in the substrate.

U.S. Pat. No. 7,021,319 issued in 2006 to S. Verhaverbeke, et al., describes assisted rinsing in a single wafer-cleaning process. The process is carried out in a single wafer-cleaning apparatus with horizontal arrangement of the wafer. After exposing a wafer to a cleaning and/or etching solution, the cleaning or etching solution is removed from the wafer by spinning the wafer and dispensing or spraying DI water onto the wafer as it is spun. The centrifugal force of the spinning wafer enhances rinsing of the wafer. In order to enhance rinsing of the wafer in the embodiment of the present invention, a solution having a lower surface tension than water, such as but not limited to isopropyl alcohol (IPA), is dispensed in liquid or vapor form onto the wafer after rinsing with DI water. In a specific embodiment of the present invention, the vapor of a solution with the lower surface tension than DI water, such as IPA vapor, is blown onto the wafer in order to break up the DI water that bulges up at the center of the spinning wafer. In another embodiment of the present invention, a gas, such N2, is blown for a short period of time onto the center of the wafer to break up the DI water that bulges up at the center of the spinning wafer. In yet another embodiment of the present invention, acoustic or sonic waves are applied to the wafer as it spins in order to help diffuse the DI water from the wafer. And in yet another embodiment of the present invention, DI water, which is dispensed onto the spinning wafer, is heated to a temperature above room temperature and preferably between 60 to 70° C. to enhance the diffusion of water from the wafer. The low surface-tension liquid, acoustic application, gas blowing, or heated DI water can be used alone or in combination in order to enhance rinsing of the wafer and thereby decreasing the rinsing time of the single wafer process to less than 20 seconds. U.S. Pat. No. 6,959,503 issued in 2005 to H. Miranda, et al., describes an environmentally sound method for quickly removing liquid from the surface of a substrate during the manufacturing process without leaving substantial residue, e.g., aforementioned watermarks. The process includes first providing a substrate (e.g., a semiconductor wafer, glass flat panel, or disc media) that has undergone one or more liquid-based processes (e.g., cleaning, scrubbing, rinsing, etc.) The upper and lower surfaces of the substrate are then subjected to vacuum suction, thereby removing liquid thereon. An apparatus for removing liquid from the surfaces of a substrate is also provided. The apparatus includes a plurality of vacuum application members configured for applying vacuum suction to surfaces of a substrate, thereby removing liquid therefrom. The vacuum application member includes, for example, vacuum slots configured for disposition in proximity to the substrate surfaces and/or at least partially porous tubes configured for moving contact with the substrate surfaces. The apparatus can process one substrate at a time or remove liquid from multiple substrates simultaneously.

U.S. Pat. No. 6,951,221 issued in 2005 to S. Okuda, et al., describes a substrate processing apparatus that is provided with a gas-liquid mixing nozzle for generating a process-liquid mist by mixing a liquid and a pressurized gas in order to discharge the process-liquid mist to a substrate at high speeds. The liquid may be remover liquid, intermediate rinse liquid, or de-ionized water. The reaction products, which have been generated on the substrate during the etching process, are removed at high speeds with the flow of the mist, whereby the quality of the process is improved. U.S. Pat. No. 6,901,685 issued in 2005 to K. Yamaguchi, et al, discloses an apparatus for drying the objects in a reduced period of time, effectively preventing contamination of the objects and preventing energy loss. The apparatus for carrying out the method of drying washed objects includes a drying tank having an opening on the upper portion thereof so that the washed objects can be placed or removed from above and a rinsing tank formed integrally with the drying tank and is capable of being sealed hermetically by closing a lid that can be opened or closed. The drying tank includes a mist-straightening vane for supplying organic solvent mist at normal temperatures to the washed objects so that the washed objects are dried by the organic solvent mist emitted from the mist-straightening vane.

U.S. Pat. No. 6,875,289 issued in 2005 to K. Christenson, et al., describes an immersion processing system for cleaning wafers with increased efficiency of chemical use. Such a system advantageously uses fewer cleaning enhancement substances, such as gas, vapor or liquid, directly to a meniscus or wafer/liquid/gas bath interface so as to effectively modify surface tensions at the meniscus with minimized chemical usage. Such a delivery system design may be applied for single-wafer processing or for processing multiple wafers together within a single liquid bath vessel. For single-wafer processing, in particular, a cleaning enhancement substance can be delivered along one or both major sides of the wafer, preferably at the meniscus that is formed as the wafer and liquid are relatively moved while the processing vessel used for such single wafer processing may, itself, be designed with a minimized size to accommodate a single wafer. By reducing the vessel volume, chemical usage for any processing chemicals that are to be provided within a liquid bath may also be advantageously reduced.

U.S. Pat. No. 6,863,741 issued in 2005 to T. Orii, et al., relates to a cleaning method and cleaning processing apparatus wherein a substrate, such as a semiconductor wafer, is subjected to a cleaning. A chemical agent, such as IPA or a solvent having a surfactant added thereto, is supplied in the form of a mist or a vapor toward the substrate which is stopped or rotated at low speed after processing with a chemical agent and subsequent rinsing processing with pure water. After the supply of the chemical agent is stopped, the substrate is rotated at a rotating speed higher than said low speed so as to centrifugally remove the chemical agent attached to the substrate.

U.S. Pat. No. 6,837,944 issued in 2005 to I. Kashkoush, et al., describes a method of cleaning semiconductor wafers before epitaxial deposition. The method comprises etching of silicon wafers with HF, rinsing the etched wafers with ozonated and ultrapure water, and drying the wafers with nitrogen and a trace amount of IPA.

U.S. Pat. No. 6,784,106 issued in 2004 to J. Bae, et al., relates to the drying of wafers in a stationary state by means of the Marangoni process. The method includes the steps of cleaning the substrate by supplying a liquid into a processing bath of a chamber, injecting dry gases onto a surface of the supplied liquid, draining the liquid from the processing bath so that the substrate is slowly exposed to the surface of the liquid, and injecting a second dry gas into the chamber and forcibly exhausting gas in the chamber. When the IPA is supplied to the wafer from above, this creates non-uniform drying conditions. U.S. Pat. No. 5,351,419 issued in 1994 to J. Franka, et al., discloses a multidirectional flow of isopropyl alcohol vapor to uniformly dry a semiconductor substrate. In one embodiment, IPA, which is generated by an external vapor source, is injected into the vapor drying system at a location near the top portion of the semiconductor substrate, while internally generated isopropyl alcohol vapors are directed toward the bottom portion of the semiconductor substrate. Therefore, both the top and the bottom portions of the semiconductor substrate are dried at approximately the same time. However, this method of achieving uniformity in drying requires the use of complicated equipment with a double IPA-vapor formation system.

It has been shown that the known wafer-drying processes described above possess a number of advantages and disadvantages, but common drawbacks of the known methods and apparatuses are complicated structure, low efficiency, the use of separate cleaning and drying chambers or parts of chambers (Marangony), or large consumption of cleaning and drying chemicals.

OBJECTS AND SUMMARY OF THE INVENTION

It is an object of the present invention to provide a single-chamber apparatus for cleaning and sequentially drying a vertically oriented semiconductor wafer substrate to high precision in a single working chamber without changing the position of the substrate during transfer from cleaning to drying. Another object is to perform cleaning in a jet-pulse mode of emission of the cleaning liquid with rotation of the wafer substrate and to continue drying with substrate rotation and without interruption of rotation during transfer for drying. A further object is to dry the wafer substrate with IPA. It is another object to provide the aforementioned apparatus with means for supplying IPA and $N_2$ in the form of a mist for more efficient interaction with residual water on the surface of the rotating wafer.

The apparatus of the invention has a closed casing that forms a sealed cleaning-drying chamber that contains a wafer-holding and rotating mechanism formed by three circumferentially and equally spaced wafer-driving rollers that are maintained in contact with the periphery of the wafer substrate and can be moved radially outward from the substrate edges for removal of the substrate after drying. A drive mechanism for the rollers is installed on the backside of the casing and comprises an adjustable-speed drive motor that rotates three drive gears through engagement with a tooth belt. The gears are attached to the rear ends of the inner shafts that pass into the cleaning-drying chamber of the apparatus and support the aforementioned wafer-driving rollers. Movement of the rollers toward and away from the wafer edge is carried out with the use of outer shafts into which the aforementioned inner shafts are rotatingly and eccentrically installed. The outer shafts can be turned in either direction by an angle sufficient for releasing the substrate edges from the driving rollers or for bringing the roller in driving contact with the edges. This is achieved due to eccentricity of the inner shafts with respect to the outer shafts. The cleaning-drying chamber can be sealed and has a closable slot in a sidewall for insertion and extraction of the wafer substrates by means of a mechanical, robotic arm. Cleaning is carried out in the jet-pulse mode with the use of two nozzle arrays arranged on both sides of the wafer and having a plurality of spray nozzles arranged in the radial direction of the wafer. The cleaning-liquid nozzles are connected to a source of DI water, while centrally located nozzles are connected to a source of nitrogen that can be used to assist and accelerate drying and for uniform distribution of IPA over the surface of the rotating wafer. The apparatus is provided with two central nozzles for the supply of gaseous nitrogen to both sides of the wafer and with a shower head that supplies a mixture of IPA and nitrogen onto the wafer from above in the form of a mist that is effectively deposited onto the surface of the vertically arranged rotating wafer having residual water that must be removed in the drying process.

DETAILED DESCRIPTION OF THE INVENTION

Figure 1:
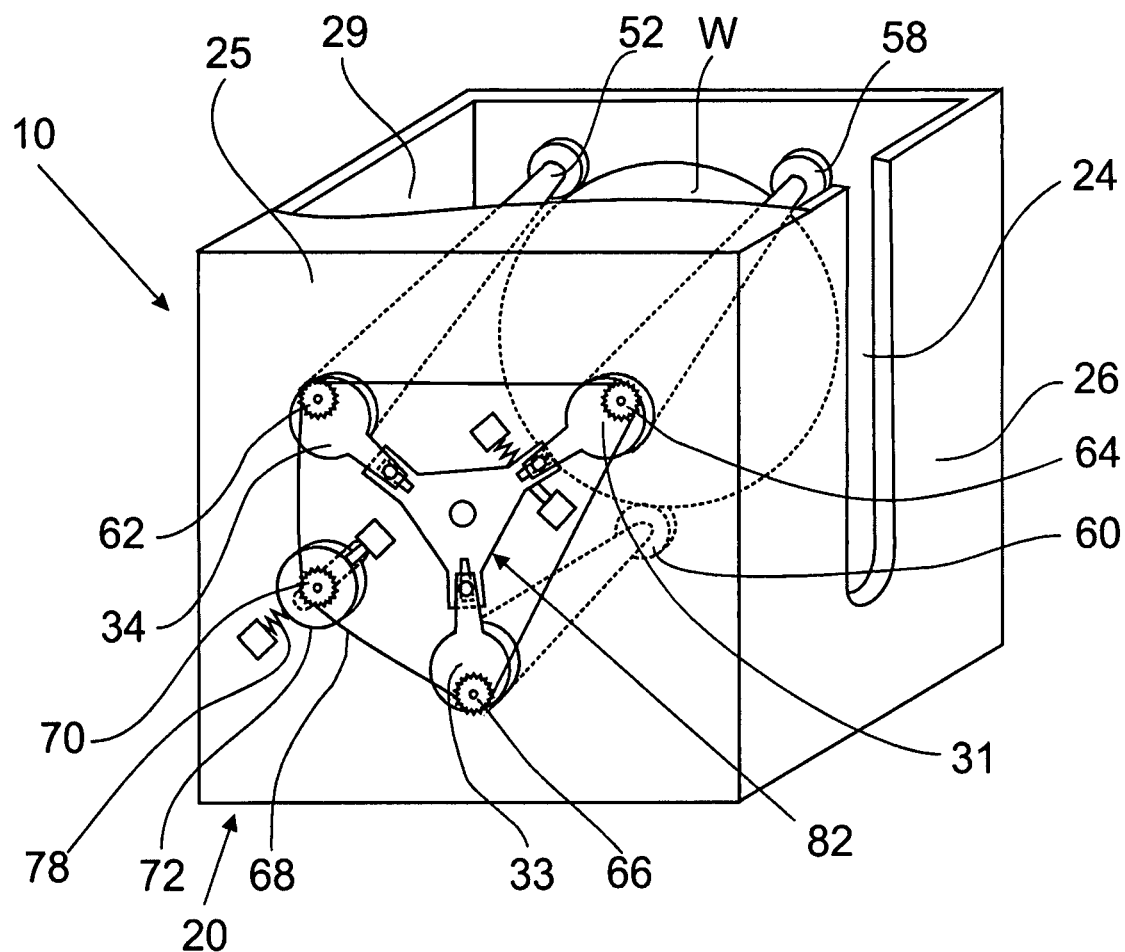
FIG. 1 is a simplified, three-dimensional sectional view of a single-chamber apparatus of the present invention for precision cleaning and drying of wafer substrates.
Figure 2:
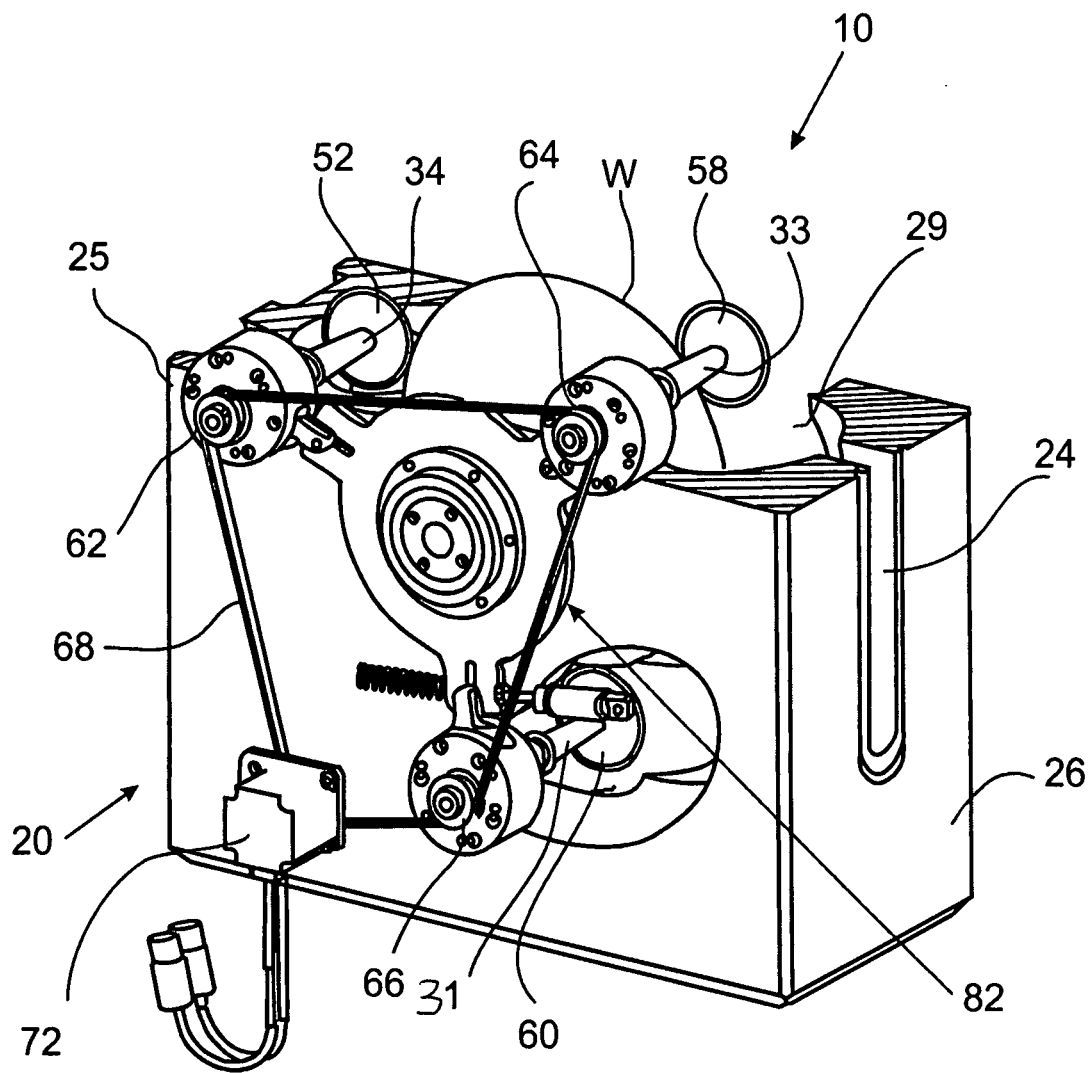
FIG. 2 is a three-dimensional view of the rear side of the apparatus with the showerhead removed, illustrating the external and internal parts of the mechanism for rotating the wafer-driving rollers.

A simplified three-dimensional sectional view of a single-chamber apparatus of the present invention for precision cleaning and drying of flat objects, such as semiconductor substrates, is shown in FIG. 1. FIG. 2 is a three-dimensional view of the rear side of the apparatus with the showerhead removed, illustrating external and internal parts of the mechanism for rotating the wafer-driving rollers.

Although the invention relates more specifically to a mechanism for precision drying, it would be useful first to describe the single-chamber cleaning and drying apparatus of the invention as a whole with all the driving, loading, and unloading mechanisms, as well as other mechanisms and devices, which, in general, have been described in earlier pending U.S. patent application Ser. No. 11/490,950, filed Jul. 24, 2006, and which are almost entirely incorporated into the apparatus of the present invention.

The apparatus, which as a whole is designated by reference numeral 10, is shown in FIG. 1 with a drying-fluid unit (which is described later) removed from the top of the apparatus for simplicity in the drawing. FIG. 1 is a simplified three-dimensional view of the apparatus 10, which shows the mechanical driving mechanisms of the apparatus. More specifically, the apparatus 10 contains a driving mechanism 20 of the invention for rotating wafer-driving rollers 52, 58, and 60. The mechanism 20 is either attached to or is formed on the rear wall 25 of a cleaning-drying chamber 29 (FIGS. 1 and 2) that has a through-closable slot 24 in its side wall 26 for insertion of a flat round object, e.g., a semiconductor wafer W, into the cleaning-drying chamber 29. A wafer W can be inserted into the cleaning-drying chamber 29 or removed therefrom in a conventional manner, e.g., by means of an end effector on the mechanical arm of an industrial robot (not shown), which can be inserted into a closable slot 24. A mechanism for closing the slot 24 is not shown.

The apparatus 10 shown in FIGS. 1 and 2 is intended for cleaning and drying semiconductor wafers or similar objects with vertical orientation of the latter.

The mechanism 20 for holding and driving semiconductor substrates, wafers, or the like, consists of three outer shafts 31, 33, and 34 circumferentially spaced from each other at equal distances (FIG. 2). Since all of these outer shafts are identical, only one of them, e.g., the outer shaft 34 will be described. The outer shaft 34 is rotatingly installed in the rear wall 25 of the drive mechanism or the cleaning chamber housing. The outer shaft 34 may be installed in sliding or roller bearings, or may, per se, have a sliding fit in the wall 25 or the chamber housing since rotation of this shaft is not critical and is needed only for slightly moving apart the contact rollers of the wafer drive mechanism, which is described below. The front end of the outer shaft 34 projects into the cleaning-drying chamber 29 and has a reduced diameter so that it does not occupy useful space of the cleaning-drying chamber 29. Furthermore, the parts of the outer shafts 31, 33, and 34 that project into the cleaning-drying chamber have smooth and streamlined surfaces.

As shown in FIG. 2, the outer shafts 31, 33, and 34 have through openings that are parallel to the axes of rotation of the outer shafts 31, 33, and 34 but are eccentrically offset therefrom for a certain distance. The outer shafts 31, 33, and 34 support inner shafts of smaller diameters (not seen in FIGS. 1 and 2), which are supported by ball bearings. Thus, the inner shafts are arranged eccentrically with respect to the axes of rotation of the outer shafts 31, 33, and 34. The front ends of the inner shafts that project into the cleaning-drying chamber 29 (FIGS. 1 and 2) rigidly support aforementioned wafer-driving rollers 52, 58, and 60.

The wafer-driving rollers are arranged circumferentially at equal distances from each other, and when a wafer W is inserted into the cleaning-drying chamber 29 or is removed from the cleaning-drying chamber 29, the rollers 52, 58, and 60 can be moved away from the wafer periphery.

On their rear ends, the inner shafts rigidly support gear wheels 62, 64, and 66, respectively, which engage an endless synchronous belt 68 that is guided over the gear wheels 62, 64, and 66 (FIG. 2). The mechanism also contains an additional gear wheel 70 (FIG. 1), which is attached to the output shaft of a rotary motor 72 and which also serves as a driving gear wheel for the synchronous belt 68 and, hence, for the gear wheels 62, 64, and 66 with their respective inner shafts and wafer-driving rollers 52, 58, and 60.

The device of the invention has a mechanism that constantly maintains the belt 68 in a tensioned state. For this purpose, a rear end of the rotary motor 72 is guided in a slot (not shown) in the rear wall 25 of the apparatus. The slot is arranged radially with respect to the belt so that when the rear end of the rotary motor 72 slides in the guide slot in the direction toward the inner shafts, the belt is tensioned. In fact, the synchronous belt 68 is constantly maintained in a stretched state, i.e., without loosening, since the additional gear wheel attached to the output shaft of the motor 72 constantly urges the belt 68 in the direction of tensioning under the effect of a compression spring 78 (FIG. 1) that pulls the motor 72 in the radial and outward direction of the belt 68.

The wafer-driving rollers 52, 58, and 60 may be in friction contact with the periphery of the wafer W, or, if the wafer has to be removed from the cleaning chamber 29, the contact rollers 52, 58, and 60 may be moved away from the periphery of the wafer W. This is achieved when the outer shafts 31, 33, and 34 are turned around their axes. Such movements toward and away from the edges of the wafer are performed by rotating the outer shafts 31, 33, and 34 by means of an eccentric shaft-turning mechanism 82, which is described in more detail in aforementioned U.S. patent application Ser. No. 11/490,950, filed Jul. 24, 2006.

When the wafer W is held between the rollers 52, 58, and 60 that frictionally engage the wafer periphery, rotation of the rollers is positively transmitted to the wafer W by means of friction engagement with the rollers. The speed of the motor 72 can be adjusted so that it can be rotated slowly with a first speed (e.g., 60 to 80 rpm) during wet cleaning, or it can be rotated with a second speed that is one to twenty times higher than the first speed, e.g., 400 to 600 rpm, during drying. All above-described movements are synchronized and controlled by a computer (not shown), which is beyond the scope of the present invention.

Figure 3:
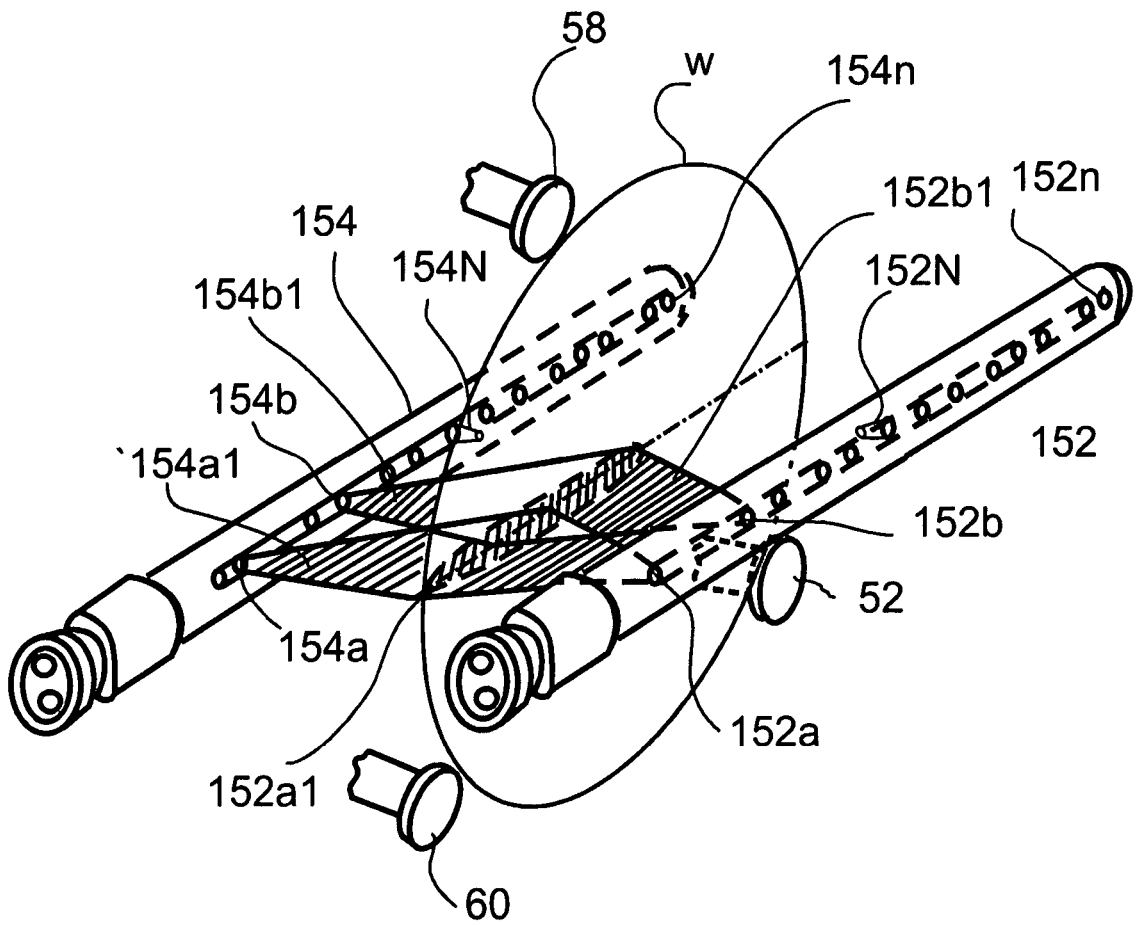
FIG. 3 is a three-dimensional view of the nozzle arrays of the apparatus of the invention for pulse-jet cleaning and drying of the wafers.
Figure 4:
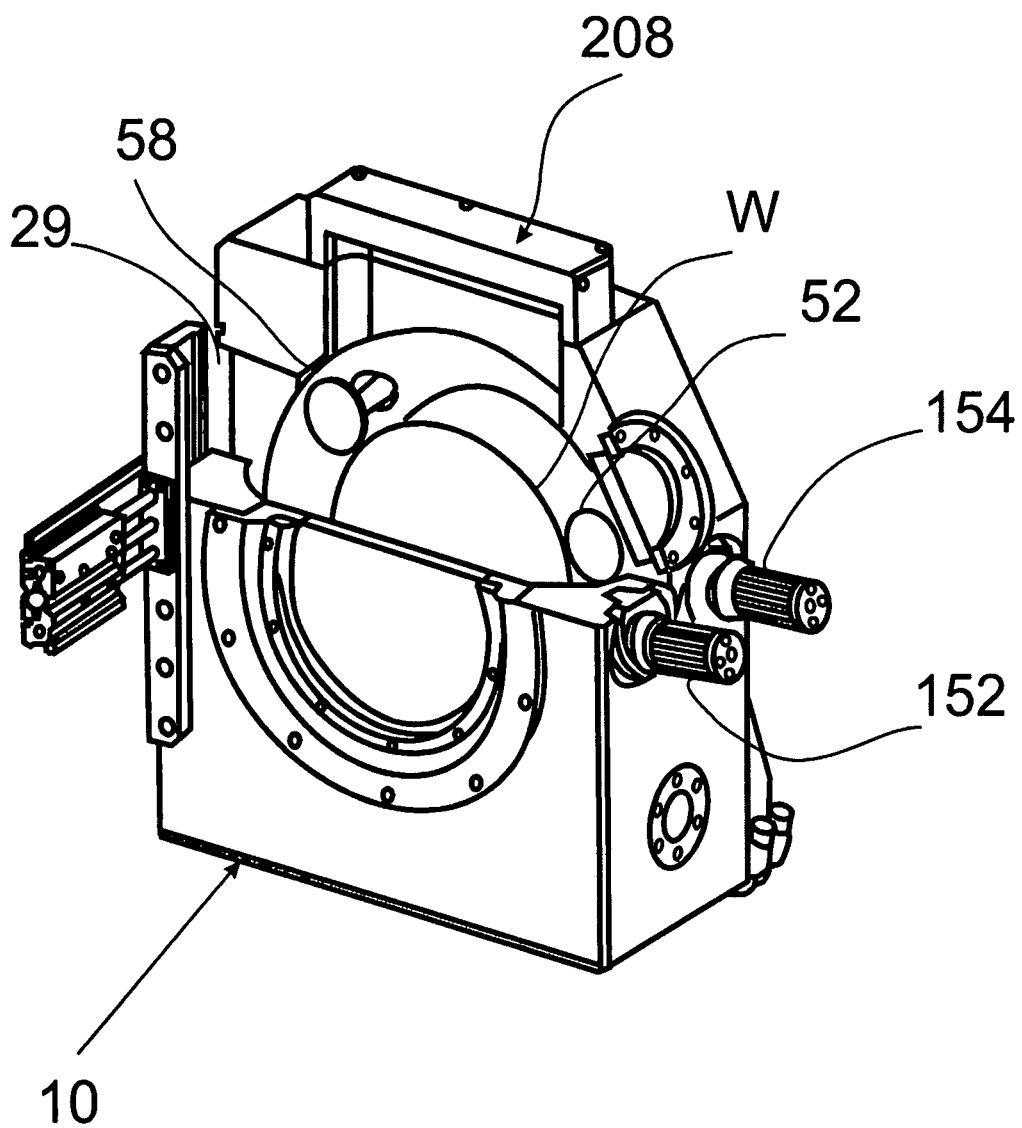
FIG. 4 is a view similar to FIG. 1 but showing some elements of the medium supply system.

The chamber also contains stationary nozzle arrays 152 and 154, which are shown in FIG. 3, and the rear ends of which are shown in FIG. 4, which is a three-dimensional view of the apparatus 10. In FIG. 4, reference numeral 208 designates a drying medium supply system.

The stationary nozzle arrays 152 and 154 are positioned on both sides of the vertical wafer W diametrically across the wafer W to clean front and back surfaces of the wafer in a simultaneous process. In the illustrated embodiment, each of the nozzle arrays contains a plurality of nozzles. Thus, the nozzle array 152 contains nozzles 152a through 152n, while the nozzle array 154 contains nozzles 154a through 154n. The nozzles are intended for emitting a washing liquid, e.g., de-ionized water. Furthermore, each nozzle array 152 and 154 has a nozzle 152N and 154N, respectively, for supply of nitrogen substantially to the center of the rotating wafer W. The liquid-supply nozzles operate in so-called rapid-pulse harmonic spray mode described in U.S. patent application Ser. No. 11/269,250, filed Nov. 9, 2005. In this mode, the nozzles inject discrete droplets of pulsed fluid streams of specific size selected to match a specific application.

The nozzles 152a through 152n and 154a through 154n use streams of discreet droplets of fluid (de-ionized water or another liquid) that are fired in rapid succession using a harmonic pulsed system (Rapid Pulse Clean system, RPC). Ultra-pure chemicals also can be sprayed in the chamber, depending on the cleaning step requirement. Acids as well as bases can be sprayed to clean the front and backside of a wafer. Planar Semiconductor's water-soluble PAD-series chemistries can also be sprayed for a variety of back-end and front-end wafer-cleaning applications. Planar's PAD-series chemistries offer an environmentally friendly alternative to the cleaning chemistries of RCA.

The jets 152a1 and 152b1, as well as the jets 154a1 and 154b1 (FIG. 3), are created by means of an electrical three-diaphragm short piston pump (not shown). Cleaning is carried out with the use of predetermined ultra-pure chemistries along with de-ionized-water rinsing of the wafer surface. Rapid-pulsed streams of chemistry and de-ionized water are fired in timed succession to clean and rinse the wafer surface, front and back, although it is not a requisite to clean the backside if not desired.

Until this point, the parts of the apparatus 10 described and shown in FIGS. 1 to 3 (except for the nitrogen-supplies nozzles 152N and 154N and the manifold 206 for the supply of the drying medium) were the same as those disclosed in the aforementioned patent application. A distinguishing feature of the apparatus 10 of the present invention is that drying of the wafer substrate after pulse jet cleaning with a cleaning liquid, e.g., DI water, is carried out in a dynamic mode, i.e., with rotation, in the same chamber as that in which cleaning was carried out without removal of the wafer substrate from the wafer-driving rollers 52, 58, and 60 but at a higher rotation speed than that during cleaning; drying is carried out with the use of a mixture of IPA and DI water with the supply of IPA (or a mixture thereof with nitrogen) through the same nozzles 152a to 152n and 154a to 154n (FIG. 3) used for the DI water. In fact, the aforementioned mixture of IPA and nitrogen comprises small droplets of IPA in a gaseous flow of nitrogen. When this "mixture" interacts with residual DI water on the surface of the wafer, an aqueous solution of IPA is formed. This solution possesses a number of properties, such as low viscosity, high volatility, etc. Provision of these properties facilitates removal of the aqueous solution of IPA from the surface of the wafer. This removal is facilitated by the supply of nitrogen through the central nozzles 152N and 154N (FIG. 3) that are fed to the surface of the wafer directly after the formation of the aforementioned aqueous solution of IPA. The time interval between the supply of the IPA-nitrogen "mixture" through nozzles 152a through 152n and 154a through 154n and initiation of the supply of nitrogen through the central nozzles 152N and 154N (FIG. 3) ranges from fractions of a second to several seconds. The supply of the drying media is accompanied by evacuation of the vapors that comprise a mixture of water with alcohol and nitrogen from the cleaning-drying chamber 29 (FIGS. 1, 2, and 4).

According to another embodiment, which is described in more detail below with reference to FIG. 5, the IPA-nitrogen "mixture" can be supplied from above through the drying-medium supply showerhead 208 located at the top of the chamber 29 along with the supply of nitrogen through the central nozzles.

It should be noted, however, that in both cases the drying stage can be initiated without stopping rotation of the wafer after discontinuing the supply of DI water. The drying process is accompanied by evacuation of the vapors from the cleaning-drying chamber, which constantly decreases the content of water and IPA while supply of nitrogen is continued. Since water is gradually removed, the process results in obtaining a completely dry wafer without any visible traces of water droplets.

Figure 5:
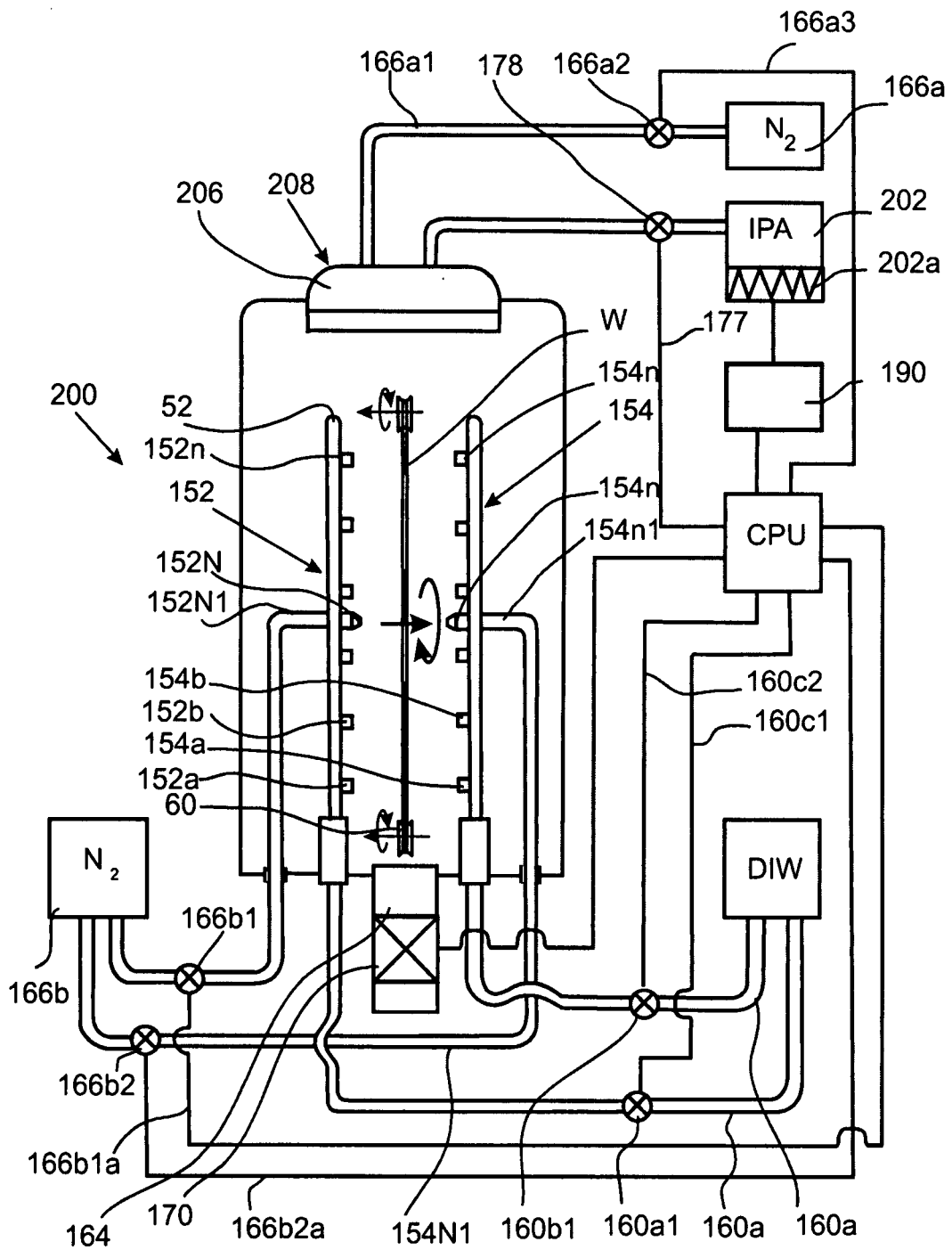
FIG. 5 is a schematic view of a cleaning and drying medium supply system of the apparatus of the invention.

As shown in FIG. 5, the apparatus of the invention is provided with a fluid distribution and supply system 200 used for cleaning and drying. The system consists of a reservoir 202 that contains a low-boiling-point liquid such as IPA, which is connected by means of a pipeline 204a or 204b (FIG. 5) with a manifold 206 of a showerhead 208 (FIGS. 4 and 5) that is located at the top of the cleaning-drying chamber 29 above the upper edge of the wafer W rotated by the driving rollers 2, 58, and 60, only two of which (52 and 60) are shown in FIGS. 4 and 5. Reference numeral 202a designates an IPA heater. The wafer W is located between the two nozzle arrays 152 and 154 (FIGS. 3 and 5).

A DI water source 162 is connected by branched pipes 160a and 160b to respective nozzle arrays 152 and 154. The pipes 160a and 160b contain respective shut-off valves 160a1 and 160b1 which are closed and opened for discontinuing or initiating the supply of DI water under control of a central processing unit (CPU) connected to the shut-off valves 160a1 and 160b1 by lines 160c1 and 160c2. The CPU is connected through a controller 190 to the IPA heater 202a and through a line 177 to a shut-off valve 178 installed in the pipeline 204a or 204b that connects the IPA reservoir 202 with the showerhead 208.

Reference numeral 166a designates a first source of gaseous nitrogen that provides a flow of nitrogen to the manifold 206 by means of pipeline 166a1, and reference numeral 166b designates a second source of gaseous nitrogen that supplies nitrogen to central nozzles 152N and 154N by means of pipelines 152N1 and 154N1, respectively. It is understood that the nitrogen sources 166a and 166b can be combined into a single nitrogen source and that the pipelines 152N1 and 154N1 can be guided to the valves 152N and 154N through the tubular housings of the nozzle arrays 152 and 154 together with the branched pipes 160a and 160b for the supply of DI water. Reference numeral 166a2 designates a shut-off valve installed in the pipeline 166a1 and connected to the CPU by means of a line 166a3.

Reference numerals 166b1 and 166b2 designate shut-off valves built into the respective pipelines 152N1 and 154N1. The shut-off valves 166b1 and 166b2 are controlled by the CPU via lines 166b1a and 166b2a. The bottom of the working chamber 29 has a drainage opening 164 that may be connected to a vacuum pump (not shown) through a shut-off valve 170.

Figure 6:
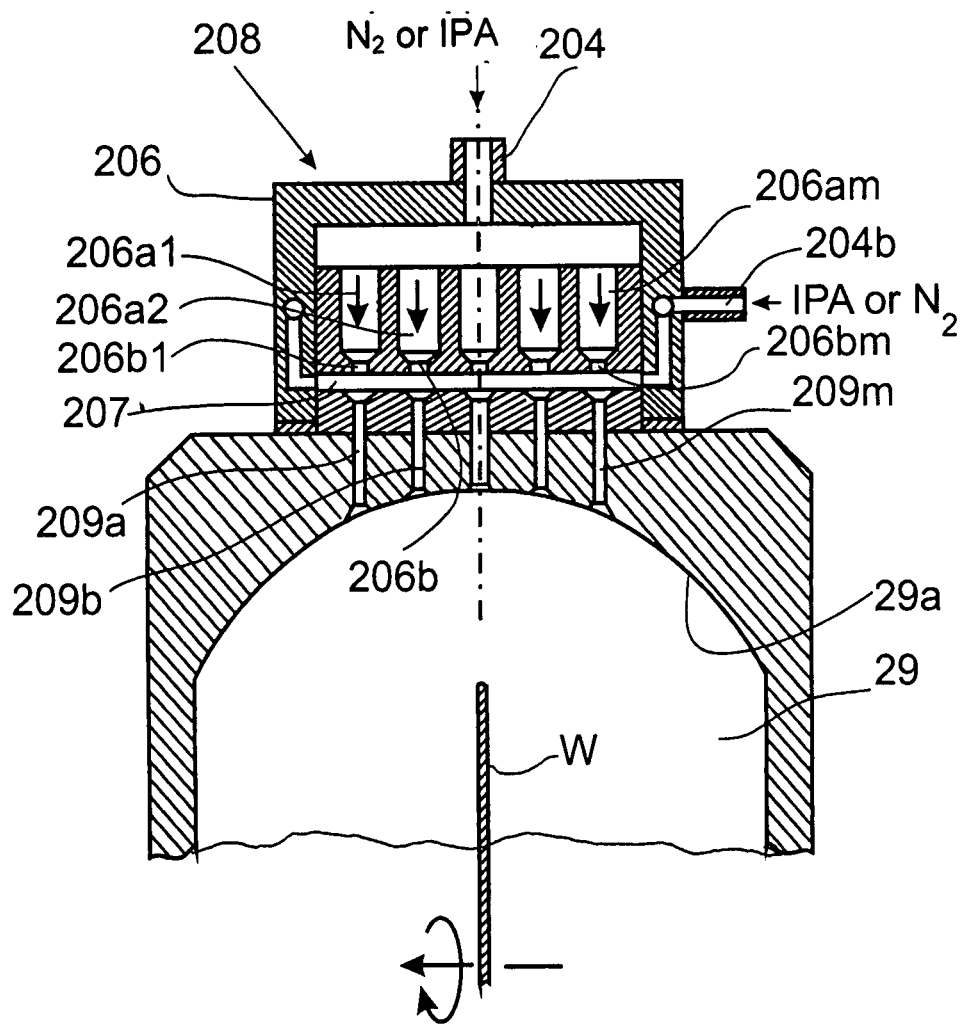
FIG. 6 is a vertical, sectional view of a showerhead of the apparatus of the invention.

FIG. 6 is a vertical sectional view that illustrates the structure of the showerhead 208. The showerhead 208 contains the aforementioned manifold (FIGS. 5 and 6) which has a common IPA collector chamber 206a connected from above to the IPA supply pipeline 204 and from below to a plurality of IPA supply channels 206a1 and 206a2 through 206am. In order to form a Bernoulli-type diffuser that facilitates suction of nitrogen into the jet flows of the IPA emitted through the exits of the IPA supply channels 206a1 and 206a2 through 206am, the exit ends of the aforementioned IPA supply channels 206a1 and 206a2 through 206am are converged to IPA exit nozzles 206b1 through 206bm. The aforementioned IPA exit nozzles 206b1 and 206b2 through 206bm are separated by a gap 207 from shower output channels 209a and 209b through 209m, which are coaxial with the IPA exit nozzles 206b1 and 206b2 through 206bm. The inputs of the shower output channels 209a and 209b through 209m are made in the form of converged funnels (not designated in FIG. 6). In fact, the IPA exit nozzles 206b1 and 206b2 through 206bm and shower output channels 209a and 209b through 209m form coaxial matrices of micro-diffusers that suck nitrogen into the flow of IPA and emit jets of IPA/$N_2$ in the form of a fog or mist into the chamber 29.

The upper surface 29a of the cleaning-drying chamber 29 has a spherical, cylindrical, or curvilinear shape optimized for preventing accumulation of liquid condensates on the surface and thus preventing undesired dripping of liquid onto the wafer W.

Thus, it has been shown that the present invention provides a single-chamber apparatus for cleaning and sequentially drying a vertically oriented semiconductor wafer substrate to high precision in a single working chamber without changing the position of the substrate during transfer from cleaning to drying. The apparatus performs cleaning in a jet-pulse mode of emission of cleaning liquid with rotation of the wafer substrate and continues drying with substrate rotation and without interruption of rotation during transfer to drying. Drying is carried out with the use of IPA. The apparatus is provided with means for supplying IPA and $N_2$ in the form of a mist for more efficient interaction with residual water on the surface of the rotating wafer.

The showerhead 208 may operate in two modes: one in which nitrogen is sucked into the flow of IPA and the other in which the flow of IPA is sucked into the flow of nitrogen. This is shown in FIG. 6, wherein each input 204a and 204b of the drying medium to the showerhead can be used either for IPA or for nitrogen.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. For example, the number of nozzles may be different from those shown in the drawings. The cleaning and drying nozzles can be located only on one side of the wafer. The cleaning nozzles 152a and 152b through 152n and 154a and 154b through 154n can be used also for the supply of nitrogen. The showerhead 208 may have a structure different from the one shown in FIG. 6. Volatile liquids other than IPA and neutral gases other than nitrogen can be used for the drying process performed in the apparatus 10.

The nozzles are not necessarily arranged in a line and may have cross-sections different from round and slit-like cross-sections. Objects other than semiconductor wafers can be cleaned with the device and by the method of the invention. A common single pump may supply a cleaning liquid to a group of simultaneously working nozzles. Mechanisms of other types can be used for rotating the object. The object may be stationary, and the head with nozzles may rotate relative to the object. Different pulse modes can be used and selected in accordance with specific operational conditions. The apparatus and method apply to the cleaning not only flat of objects but also to vertically oriented objects of three-dimensional configurations, and the nozzles may be shifted axially to provide optimal distances to the areas to be cleaned.

The invention claimed is:

1. A single-chamber apparatus to precisely clean and dry flat objects, the apparatus comprising:
    a sealed housing having a cleaning-drying chamber that includes a mechanism to rotate a vertically-oriented flat object with a first speed, and to rotate the vertically-oriented flat object with a second speed that is from about one to about twenty times higher than the first speed, the cleaning-drying chamber being single chamber, the cleaning-drying chamber further being not configured to immerse wafers for cleaning; and
    a cleaning and drying medium supply system to supply a flow of cleaning liquid to the cleaning-drying chamber when the vertically-oriented flat object is rotated with the first speed and to supply a drying medium when the vertically-oriented flat object is rotated with the second speed, the vertically-oriented flat object to be rotated without interruption during transfer from cleaning to drying, the cleaning and drying medium supply system comprising:
        at least one cleaning liquid nozzle array with a plurality of cleaning liquid supply nozzles arranged opposite to the surface of the vertically-oriented flat object;
        a source of the cleaning liquid coupled to the cleaning liquid supply nozzles;
        at least one neutral gas supply nozzle to supply a flow of neutral gas to the center of the vertically-oriented flat object;
        a source of neutral gas coupled to the at least one neutral gas supply nozzle;
        a source of a volatile alcohol capable of forming an aqueous solution;
        means for the formation of a flow of a drying medium and for the formation of a mist of the drying medium supplied to the surface of the vertically-oriented flat object when the flat object is rotated with the second speed; and
        means for evacuation of the cleaning liquid, the drying medium, gases, and mixtures thereof formed during drying in the cleaning-drying chamber.

2. The apparatus of claim 1, wherein the means for the formation of a drying-medium mist comprises a showerhead located inside and in the upper part of the cleaning-drying chamber and comprising a matrix of micro-diffusers to form a mixture of the volatile alcohol with the neutral gas in the form of a mist.

3. The apparatus of claim 2, wherein the matrix of micro-diffusers comprises:
    a plurality of micro-channels coupled to the source of the volatile alcohol;
    a plurality of shower-output channels that each exit to the cleaning-drying chamber above the vertically-oriented flat object and are each coaxial with respective ones of the plurality of micro-channels; and
    a gap between the each of the plurality of micro-channels and respective ones of the plurality of shower-output channels, the gaps being coupled to a second source of the neutral gas.

4. The apparatus of claim 2, wherein the matrix of micro-diffusers comprises:
    a plurality of micro-channels coupled to the source of neutral gas;
    a plurality of shower-output channels that exit to the cleaning-drying chamber above the vertically-oriented flat object and are coaxial with respective ones of the plurality of micro-channels; and
    a gap between each of the plurality of micro-channels and respective ones of the plurality of shower-output channels, the gaps being coupled to the source of the volatile alcohol.

5. The apparatus of claim 3, wherein the volatile alcohol is isopropyl alcohol, the neutral gas is nitrogen, and the vertically-oriented flat object is a semiconductor wafer.

6. The apparatus of claim 4, wherein the volatile alcohol is isopropyl alcohol, the neutral gas is nitrogen, and the vertically-oriented flat object is a semiconductor wafer.

7. The apparatus of claim 1, wherein the cleaning-drying chamber has an upper wall that has one shape selected from shapes consisting of a spherical shape, a cylindrical shape, and a curvilinear shape to limit an accumulation of condensates of cleaning liquid on the upper wall.

8. The apparatus of claim 5, wherein the cleaning-drying chamber has an upper wall that has one shape selected from shapes consisting of a spherical shape, a cylindrical shape, and a curvilinear shape to limit an accumulation of condensates of cleaning liquid on the aforementioned upper wall.

9. The apparatus of claim 6, wherein the cleaning-drying chamber has an upper wall that has one shape selected from shapes consisting of a spherical shape, a cylindrical shape, and a curvilinear shape to limit an accumulation of condensates of cleaning liquid on the aforementioned upper wall.

10. The apparatus of claim 1, further comprising means for controlling the flow of the cleaning liquid, the flow of neutral gas, and the flow of the drying medium.

11. The apparatus of claim 3, further comprising means for controlling the flow of the cleaning liquid, the flow of neutral gas, and the flow of the drying medium.

12. The apparatus of claim 4, further comprising means for controlling the flow of the cleaning liquid, the flow of neutral gas, and the flow of the drying medium.

13. The apparatus of claim 1, wherein the mechanism to rotate the vertically-oriented flat object comprises:
- at least three outer shafts rotatingly installed in the sealed housing, each of the at least three outer shafts having an axis of rotation, a front end that extends out from the cleaning-drying chamber, and a rear end that extends into the cleaning-drying chamber;
- at least three inner shafts that are rotatingly installed in respective ones of the at least three outer shafts, each of the at least three inner shafts having a front end that extends to the outside from the sealed housing and a rear end that extends through the rear ends of the respective ones of the at least three outer shafts, each of the at least three inner shafts having an axis of rotation that is offset from the axes of rotation of the at least three outer shafts;
- rotary drive members rigidly attached to respective ones of the front ends of each of the at least three inner shafts;
- contact members rigidly attached to respective ones of the rear ends of each of the at least three inner shafts;
- a mechanism to turn each of the at least three outer shafts in one direction and in a direction opposite to the one direction to move the contact members apart to release the vertically-oriented flat object or toward each other to come into frictional contact with the vertically-oriented flat object due to the offset; and
- a mechanism to simultaneously rotate each of the at least three inner shafts together with the contact members to frictionally rotate the vertically-oriented flat object when the contact members are moved toward each other.

14. The apparatus of claim 13, wherein the vertically-oriented flat object has a periphery and the contact members are contact rollers that are configured to rotate the vertically-oriented flat object when the contact rollers are rotated by the drive mechanism to simultaneously rotate the at least three inner shafts and when the contact rollers come into contact with the periphery.

* * * * *